United States Patent [19]

Segawa et al.

[11] Patent Number: 4,549,102

[45] Date of Patent: Oct. 22, 1985

[54] DRIVER CIRCUIT HAVING A BOOTSTRAP BUFFER CIRCUIT

[75] Inventors: Makoto Segawa; Shoji Ariizumi, both of Tokyo, Japan

[73] Assignee: Tokyo Shibaura Denki Kabushiki Kaisha, Japan

[21] Appl. No.: 709,360

[22] Filed: Mar. 8, 1985

Related U.S. Application Data

[63] Continuation of Ser. No. 367,663, Apr. 12, 1982.

[30] Foreign Application Priority Data

Apr. 16, 1981 [JP] Japan .................................. 56-57581

[51] Int. Cl.[4] .................. H03K 17/284; H03K 17/30; H03K 19/003; H03K 19/096

[52] U.S. Cl. .................................... 307/578; 307/481; 307/482; 307/449; 307/463; 365/227; 365/233; 365/194

[58] Field of Search ............... 307/482, 583, 584, 262, 307/264, 269, 592, 593, 594, 595, 596, 602, 603, 606, 608, 449, 463, 270; 365/104, 194, 203, 227, 228, 230, 233

[56] References Cited

U.S. PATENT DOCUMENTS

| 4,013,902 | 3/1977 | Payne | 307/594 |
|---|---|---|---|
| 4,069,429 | 9/1976 | White et al. | 307/595 X |
| 4,090,096 | 5/1978 | Nagami | 307/482 X |
| 4,122,361 | 10/1978 | Clemen et al. | 307/262 X |
| 4,275,312 | 6/1981 | Saitou et al. | 307/449 X |
| 4,374,430 | 2/1983 | Higuchi | 307/449 X |
| 4,385,369 | 5/1983 | Sheppard | 365/227 |
| 4,393,480 | 7/1983 | Shimada | 365/227 |

OTHER PUBLICATIONS

Patel, "Precharge for Bootstrap Circuit", IBM Tech. Discl. Bull., vol. 20, No. 7, p. 2748, Dec. 1977.
Hsieh et al., "MOSFET Storage Array Addressing System", IBM Tech. Discl. Bull., vol. 13, No. 8, pp. 2383-2384, Jan. 1971.

Primary Examiner—Stanley D. Miller
Assistant Examiner—David R. Bertelson
Attorney, Agent, or Firm—Finnegan, Henderson, Farabow, Garrett & Dunner

[57] ABSTRACT

A drive circuit which includes a plurality of load MOS transistors coupled in series between a positive power source terminal and a node point, a plurality of drive MOS transistors coupled in parallel between a ground terminal and the node point, a static type bootstrap buffer circuit connected at the input terminal to the node point, and a gate control circuit for controlling the conduction states of the load and drive MOS transistors. The gate control circuit renders the load MOS transistors conductive, and then renders the drive MOS transistors nonconductive after the load MOS transistors are rendered fully conductive.

5 Claims, 8 Drawing Figures

DRIVER CIRCUIT HAVING A BOOTSTRAP BUFFER CIRCUIT

This application is a continuation of application Ser. No. 367,663, filed Apr. 12, 1982.

BACKGROUND OF THE INVENTION

The present invention relates to a drive circuit.

There has been known a drive circuit of the push-pull type as shown in FIG. 1, as a drive circuit for driving a node accompanied by a large stray capacitance. The drive circuit is comprised of an E/D type inverter 2 for inverting an input signal VI and including a depletion type (D-type) MOS transistor TR2 and an enhancement type (E-type) MOS transistor TR4, and a push-pull circuit 4 containing D-type and E-type MOS transistors TR6 and TR8 whose current paths are connected in series between the power source terminals VD and VS. The input signal VI is applied to the gates of the MOS transistors TR4 and TR6. The output signal from the inverter 2 is supplied to the gate of the E-type MOS transistor TR8. A stray capacitor C1 is charged and discharged by the output signal from the push-pull circuit 4.

The drive circuit is superior to the inverter drive circuit of the E/D-type in that a DC current may be small and in that a large capacitor can be charged, although it has a relatively low power consumption, since the flow of a large charge current is allowed only during the switching transient time. In the drive circuit, the output stage is comprised of the E/D-type push-pull circuit, as described above. Because of this, the DC current flows through the push-pull circuit.

To prevent the generation of such DC current, an approach thus far proposed is a bootstrap buffer circuit of the static type using an E/E-type output circuit, as shown in FIG. 2, to allow a high level output signal to rise up to VD. The buffer circuit is formed of an inverter 2 for inverting an input signal VI comprised of a D-type MOS transistor TR2 and an E-type MOS transistor TR4, an output circuit 6 comprised of E-type MOS transistors TR12 and TR14 whose current paths are series-connected between the power source terminals VD and VS, and an E-type MOS transistor TR16 whose current path is coupled between the input terminal VI and the gate of the MOS transistor TR12. An output signal of the inverter 2 is supplied to the gate of the MOS transistor TR14 and a capacitor C2 is coupled between a node 8 between the MOS transistor TR12 and TR14 and the gate of the MOS transistor TR12.

In the buffer circuit, when the input signal VI goes to "1" level, the charging operation of the capacitor C2 starts. The charging operation continues until the input signal VI reaches a threshold voltage of the MOS transistor TR4 to render the MOS transistor TR4 conductive and the output signal from the inverter 2 falls below the threshold voltage of the MOS transistor TR14 to render the transistor TR14 nonconductive. When the MOS transistor TR14 is rendered nonconductive, the potential at the node 8 goes to "1" level, so that the potential at the other end of the capacitor C2 rapidly rises due to the bootstrap action. As a result, a voltage higher than the voltage VD is applied to the gate of the transistor TR12, and the power source voltage VD is supplied to the node 8 through the MOS transistor TR12. In other words, the potential at the node 8 rises up to the power source voltage VD. When the input signal VI goes to "0" level, a "1" level signal is generated from the inverter 2 to render the MOS transistor TR14 conductive and to discharge the capacitor C2. In this case, the MOS transistor TR12 is nonconductive and hence no stationary current flows in the output circuit 6. Therefore, the power consumption is reduced to an extremely small value.

In a static random access memory (RAM), 30 to 40% of the normal power consumption is consumed in a row decoder. Accordingly, for reducing the power consumption of the static RAM, it is very important to reduce the power consumption in the row decoder. For this reason, by using the boot strap circuit shown in FIG. 2, for example, for the row decoder buffer, the power consumption of the row decoder and thus of the overall RAM system can be limited to a small value.

Turning now to FIG. 3, there is shown a practical arrangement of a static type RAM using the bootstrap buffer circuit shown in FIG. 2 for the row decoder circuit. The static RAM is comprised of an address buffer circuit 10 for generating a row address signal, and an address decoding circuit 20 for decoding a row address signal derived from the address buffer circuit 10 to produce first and second output signals, and bootstrap type buffer circuits 30 and 40 for supplying a row selection signal to a memory matrix in response to the first and second output signals from the address decoding circuit 20. The address decoding circuit 20 is comprised of drive MOS transistors TR21 to TR2N coupled in parallel between a node N1 and a power source terminal VS, drive MOS transistors TR31 to TR3N coupled in parallel between a node N2 and the power source terminal VS, load transistors TR41 to TR4N coupled in series between the node N1 and a power source terminal VD, a load MOS transistor TR40 whose current path is connected to the node N2 at one end and to the node N1 through the MOS transistor TR41 at the other end. The gates of these MOS transistors are so connected as to receive an address signal from the address buffer circuit 10, the gates of these MOS transistors TR21 and TR31 are coupled with the gates of the MOS transistors TR40 and TR41, respectively, and the gates of the MOS transistors TR22 to TR2N are coupled with the gates of the MOS transistors TR32 to TR3N, respectively.

The buffer circuit 30 is formed of a first inverter for inverting a first output signal from the decoding circuit 20, which is formed of a D-type MOS transistor TR51 and an E-type MOS transistor TR52, a second inverter for inverting an output signal from the first inverter, which is formed of E-type MOS transistors TR53 and TR54, a capacitor C3 coupled between the gate of the MOS transistor TR53 and a node N3 of the MOS transistors TR53 and TR54, a MOS transistor TR55 having a current path connected between the gates of the MOS transistors TR52 and TR53, and a third inverter formed of E-type MOS transistors TR56 and TR57 having current paths serially coupled between the power source terminals VD and VS. The gates of these MOS transistors TR56 and TR57 are respectively coupled with the gates of the MOS transistors TR53 and TR54. A node N4 between the MOS transistors TR56 and TR57 is used as an output terminal of the buffer circuit 30 and is coupled with a word line WL1 of the memory matrix.

The buffer circuit 40, like the buffer circuit 30, is formed of MOS transistors TR61 to TR67 and a capacitor C4 which respectively correspond to the transistors TR51 to TR57 and the capacitor C3 in the buffer circuit 30. In the buffer circuit 40, a node N5 between the MOS transistors TR66 and TR67 is used as an output terminal from which an output signal corresponding to the second output signal from the address decoding circuit 20 is supplied to a word line WL2 of the memory matrix.

Assume now that a first output signal from the address decoding circuit 20, i.e. a potential at the node N1, is at "0" level. In this case the MOS transistor TR52 is kept nonconductive. As a result, the MOS transistors TR54 and TR57 are conductive, the capacitor C3 is kept in a discharge state, and a "0" level signal is produced from the output terminal N4. Then, a potential at the node N1 of the address decoding circuit 20 goes to "1" level, the capacitor C3 is charged through the MOS transistor TR55. Then the potential at the node N1 reaches the threshold voltage of the MOS transistor TR52 to render the MOS transistor conductive. At this time the MOS transistors TR54 and TR57 are nonconductive and the potentials at the nodes N3 and N4 abruptly rise to "1" level. Then the potential at the other end of the capacitor C3 or the gates of the MOS transistors TR53 and TR56 is abruptly risen to a voltage level above the voltage VD, through the bootstrap action, thereby setting the MOS transistors TR53 and TR56 completely conductive. As a result, the potentials at the nodes N3 and N4 are kept at the VD level. Therefore, the word line WL1 accompanied by a large stray capacitance can be driven satisfactorily.

For example, where the potential at the node N1 in the address decoding circuit 20 is shifted from "0" level to "1" level, an address signal AS2 changing from a high level to a low level, as shown in FIG. 4, is applied to gates of the MOS transistors TR21 to TR2N, and at the same time, an address signal AS1 changing from a low level to high level is applied to the gates of the MOS transistors TR41 to TR4N. Consequently, the MOS transistors TR21 to TR2N are nonconductive, the MOS transistors TR41 to TR4N are conductive, and the potential at the node N1 changes from "0" level to "1" level, as indicated by a broken line NP1.

In this type of row decorder circuit, a constant current flows only through the MOS transistors TR51 and TR52 in a selected buffer circuit, for example, the buffer circuit 30. Therefore, the power consumption of the decoder circuit is extemely small. When the output signal from the address decoding circuit 20, the potential at the nodes N1 and N2 is dull in its rise time characteristic, however, a proper bootstrap operation is not performed in the buffer circuits 30 and 40. When the rise time characteristic of the potential at the node N1 in the decoding circuit 20 is gentle, for example, the MOS transistor TR52 is rendered conductive before the capacitor C3 of the buffer circuit 30 is satisfactorily charged, so that the MOS transistor TR54 is rendered nonconductive, the potential at the node N3 rises and hence the gate potential of the MOS transistors TR53 and TR56 rises. However, since the capacitor C3 is insufficiently charged, an insufficient bootstrap action is obtained, the rise of the potential at the node N4 is gentle and the potential at the node N4 fails to rise up to the VD level. In order to obtain a proper bootstrap operation in the buffer circuits 30 and 40, it is necessary that the rise time characteristic of a drive signal for the MOS transistors TR40 to TR4N is made steep and the rise time characteristic of the output signal from the address decoding circuit 20 is made steep. To this end, it is necessary to enlarge the dimensions of the MOS transistors making up the address buffer circuit 10 for driving these MOS transistors TR40 to TR4N, increasing the power consumption in this circuit.

SUMMARY OF THE INVENTION

Accordingly, an object of the present invention is to provide a circuit with small power consumption and at high operation speed.

According to one aspect of the present invention, there is provided a drive circuit comprising a bootstrap buffer circuit of the static type, first drive means for driving the bootstrap buffer circuit having a load MOS transistor circuit and a drive MOS transistor circuit coupled in series with the load MOS transistor circuit, and second drive means for applying to the first drive means a first drive signal for rendering the load MOS transistor circuit conductive and a second drive signal for rendering the drive MOS transistor circuit nonconductive, the second drive signal being delayed with respect to the first drive signal.

In the present invention, for changing a level of the output signal from the first drive means from "0" level to "1" level, for example, the load MOS transistor circuit is first made conductive. Under this condition, an ON resistance of the load MOS transistor circuit in the ON state is larger than an ON resistance of the drive MOS transistor circuit in the ON state. Therefore, the output signal from the first drive means is kept at "0" level. Subsequently, when the drive MOS transistor circuit is set to a nonconductive state, the output signal from the first drive means steeply rises from "0" level to "1" level. As a result, the bootstrap buffer circuit executes a proper bootstrap operation to drive the output line with a sufficient drive ability.

DETAILED DESCRIPTION OF THE PREFERRED EMBODIMENTS

An embodiment of a drive circuit according to the present invention will be described referring to FIGS. 5 to 7.

Figure 3:
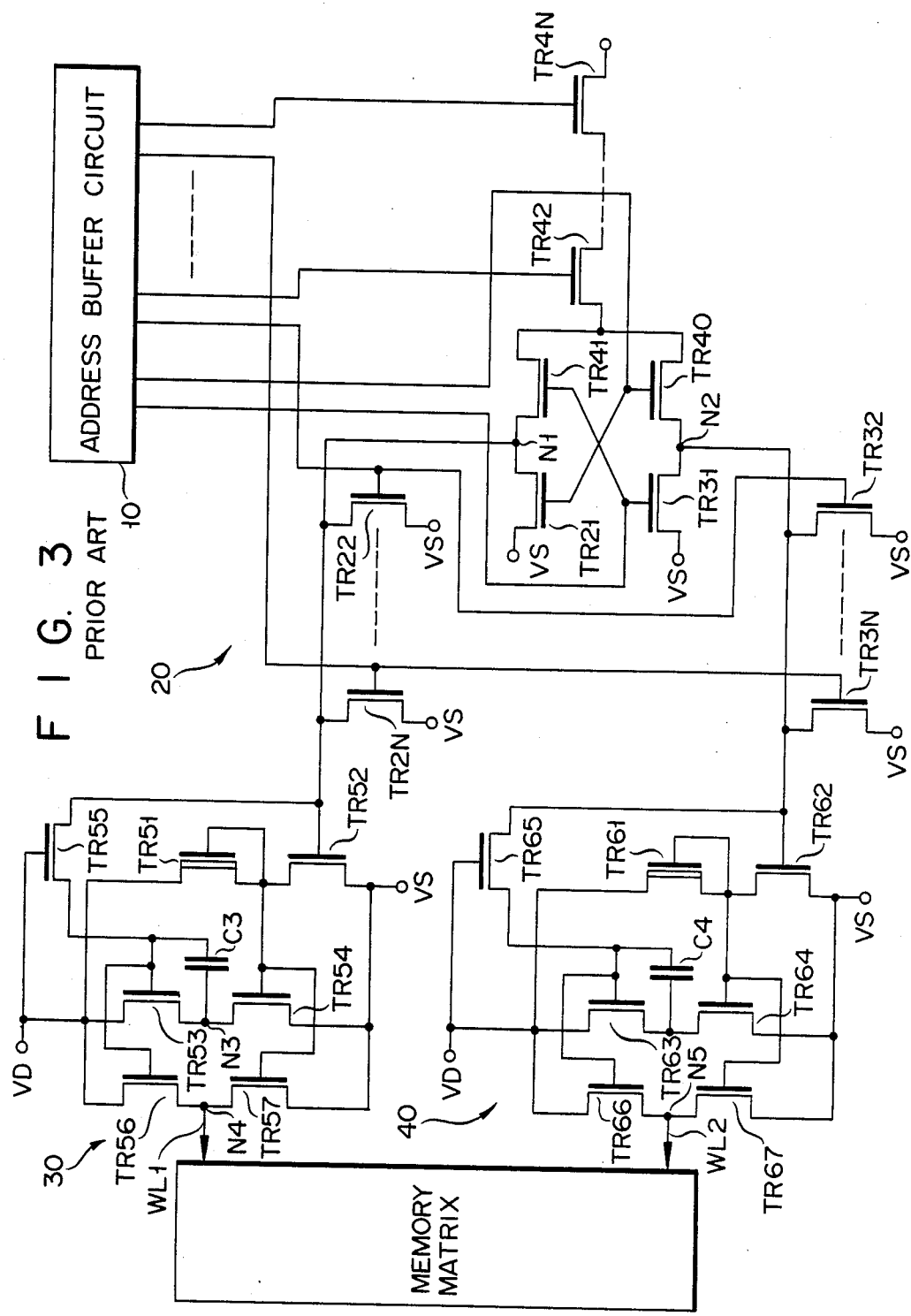
FIG. 3 is a circuit diagram of a memory device with a row decoder having bootstrap buffer circuits.
Figure 5:
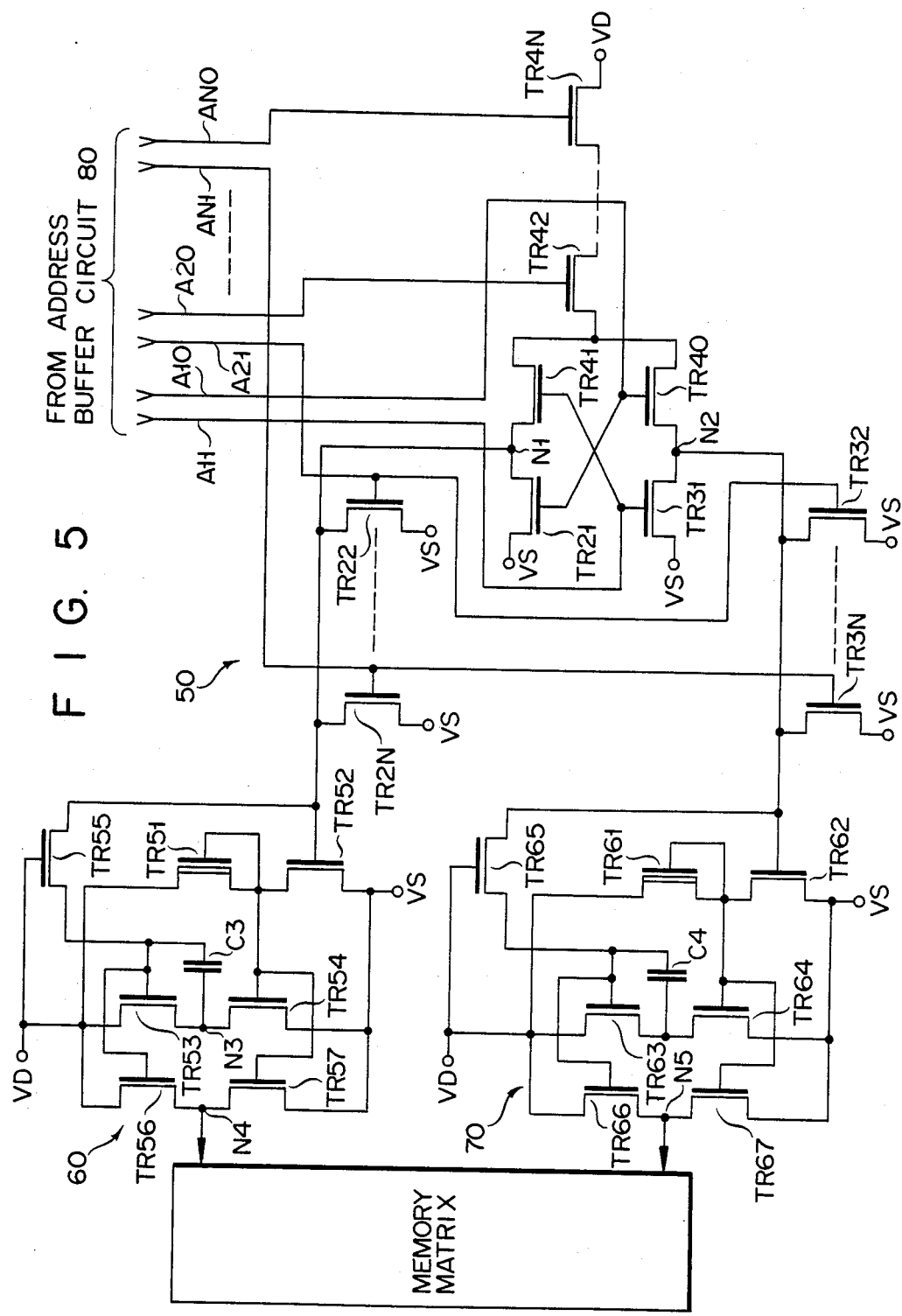
FIGS. 5 to 7 are circuit diagrams of a drive circuit of an embodiment according to the present invention.
Figure 6:
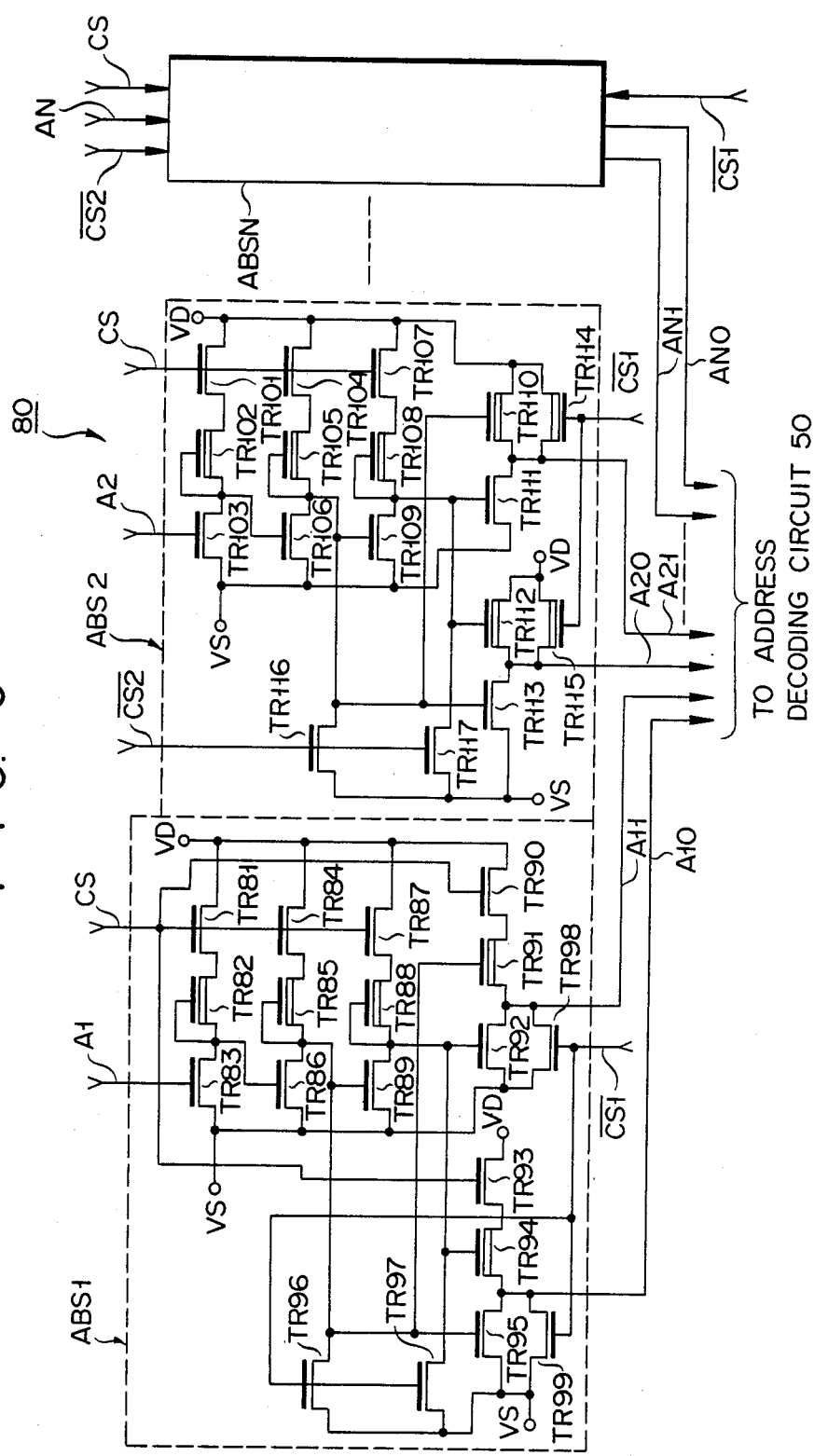
Figure 7:
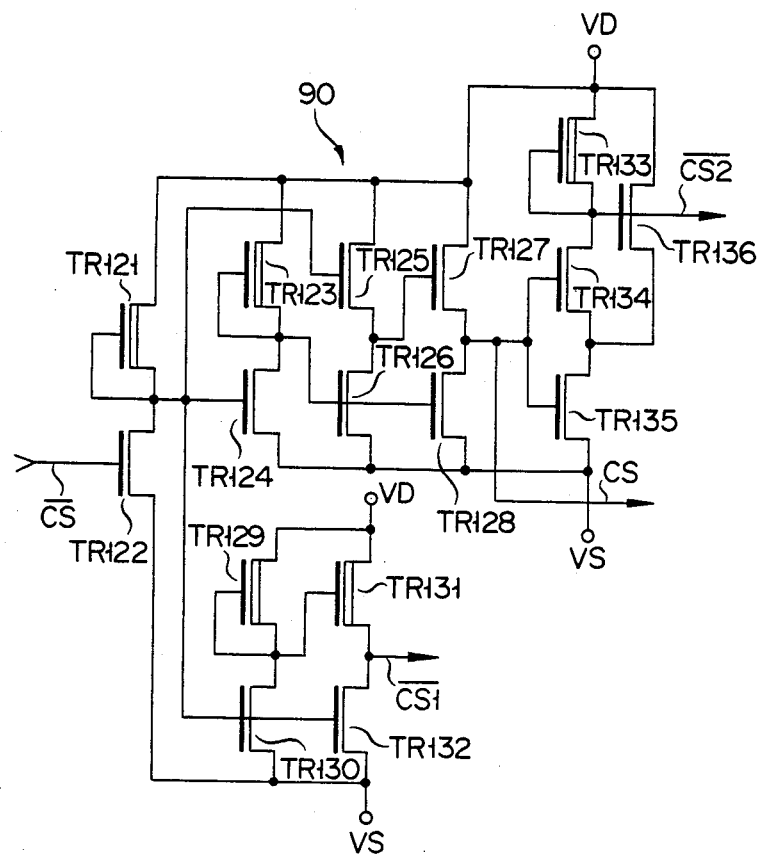

The drive circuit includes an address decoding circuit 50 and bootstrap buffer circuits 60 and 70 shown in FIG. 5, an address circuit 80 shown in FIG. 6, and a chip select circuit 90 shown in FIG. 7. The address decoding circuit 50 and the bootstrap buffer circuits 60 and 70 shown in FIG. 5 are similar to those circuits 20, 30 and 40 shown in FIG. 3, in their constructions and operations. Accordingly, like reference symbols are used to designate like portions in FIG. 3, for simplicity of explanation.

FIG. 6 shows an address buffer circuit for driving the address decoding circuit 50 shown in FIG. 5. The address buffer circuit is provided with address buffer sections ABS1 and ABSN which receive address signals A1, A2, ..., and AN from the address signal generating circuit (not shown) and produce address signals A10 and A11, A20 and A21, ..., and AN0 and AN1. The address buffer section ABS1 includes five sets of series circuits of MOS transistors TR81 to TR83, TR84 to TR86, TR87 to TR89, TR90 to TR92, and TR93 to TR95, the current paths of the transistors in each series circuits are coupled in series between the power source terminals VD and VS. MOS transistors TR82, TR85, TR88, TR91 and TR94 are of the D-type; MOS transistors TR83, TR86, TR89, TR92 and TR95 to TR99 are of the E-type; the remaining transistors are of the intrinsic type (I-type) having a threshold voltage of about 0 V. The drains of the MOS transistors TR81, TR84, TR87, TR90 and TR93 are coupled with the power source terminal VD. The sources of the MOS transistors TR83, TR86, TR89, TR92 and TR95 are connected to the power source terminal VS. A node between the MOS transistors TR82 and TR83 is connected to the gates of the MOS transistors TR82 and TR86. A node between the MOS transistors TR85 and TR86 is connected to the gates of the MOS transistors TR85, TR89 and TR95 and further to the power source terminal VS through the MOS transistor TR96. A node between the MOS transistors TR88 and TR89 is connected to the gates of the MOS transistors TR88, TR92 and TR94, and further to the power source terminal VS through the MOS transistor TR97. The MOS transistors TR98 and TR99 are coupled in parallel with the MOS transistors TR92 and TR95, respectively.

Since the interconnection of the address buffer sections ABS2 to ABSN are substantially the same, only the address buffer section ABS2 as a typical example, will be described in detail, for simplicity of explanation. The address buffer section ABS2 is provided with MOS transistors TR101 to TR109 arranged like the MOS transistors TR81 to TR89 in the address buffer section ABS1. The address buffer section ABS2 is further provided with two series circuits of MOS transistors TR110 and TR111, and MOS transistors TR112 and TR113, the current paths of the transistors in each series circuit are connected in series between the power source terminals VD and VS, MOS transistors TR114 and TR115 respectively coupled in parallel with the MOS transistors TR110 and TR112. A node between the MOS transistors TR105 and TR106 is connected to the gate of the MOS transistors TR110 and TR113 and to the power source terminal VS through a MOS transistor TR116. A node between the MOS transistors TR108 and TR109 is connected to the gates of the MOS transistors TR111 and TR112 and to the power source terminal VS through a MOS transistor TR117. The MOS transistors TR102, TR105, TR108, TR110, TR112, TR114 and TR115 are the D-type; the MOS transistors TR103, TR106, TR109, TR111, TR113, TR116 and TR117 are of the E-type; the remaining transistors are of the I-type. Address signals A2 to AN from an address signal generating circuit (not shown) are supplied to the gates of the MOS transistors in the address buffer sections ABS2 to ABSN, which correspond to the MOS transistor TR83 in the address buffer section ABS1. The address signal A2, for example, is applied to the gate of the MOS transistor TR103 in the address buffer section ABS2. A first output signal A11 is derived from a node between the MOS transistors TR91 and TR92 in the address buffer section ABS1. A second output signal A10 is derived from a node between the MOS transistors TR94 and TR95. In the address buffer sections ABS2 and ABSN, first output signals A21 to AN1 are each derived from a node between the MOS transistors corresponding to the MOS transistors TR91 and TR92. Second output signals A20 to AN0 are each derived from a node between the MOS transistors corresponding to the MOS transistors TR94 and TR95. For example, in the address buffer section ABS2, the first output signal A21 is derived from a node between the MOS transistors TR110 and TR111, and the second output signal A20 is derived from a node between the MOS transistors TR112 and TR113.

A chip select circuit shown in FIG. 7 is comprised of six series circuits of MOS transistors TR121 and TR122, TR123 and TR124, TR125 and TR126, TR127 and TR128, TR129 and TR130, and TR131 and TR132. These six series circuits are each connected in series between the power source terminals VD and VS. The chip select circuit is further provided with MOS transistors TR133, TR134 and TR135 connected in series between the power source terminals VD and VS, and a MOS transistor TR136 connected between the power source terminal VD and a node between the MOS transistors TR134 and TR135. The MOS transistors TR121, TR123, TR129, TR131 and TR133 are of the D-type; the MOS transistors TR125 and TR127 are of the I-type; the remaining MOS transistors are of the E-type. A node between the MOS transistors TR121 and TR122 is coupled with the gates of the MOS transistors TR121, TR124, TR125, TR130 and TR132. A node between the MOS transistors TR123 and TR124 is connected to the gates of the MOS transistors TR123, TR126 and TR128. A node between the MOS transistors TR125 and TR126 is connected to the gate of the MOS transistor TR127. A node between the MOS transistors TR127 and TR128 is connected to the gates of the MOS transistors TR134 and TR135. A node between the MOS transistors TR133 and TR134 is connected to the gate of the MOS transistor TR136. A node between the MOS transistors TR129 and TR130 is connected to the gates of the MOS transistors TR129 and TR131.

In the chip select circuit 90 shown in FIG. 7, when a chip select signal $\overline{CS}$ at "0" level is produced from the chip select signal generating circuit (not shown), a chip select signal CS at "1" level is derived from the node between the MOS transistors TR127 and TR128, a chip select signal $\overline{CS1}$ at "0" is derived from the node between the MOS transistors TR131 and TR132, and a chip select signal $\overline{CS2}$ at "0" level is derived from the node between the MOS transistors TR133 and TR134. Upon receipt of these chip select signals CS, $\overline{CS}$, $\overline{CS1}$, and $\overline{CS2}$, the address buffer circuit shown in FIG. 6 is kept active. When the address signals A1 to AN are at "0" level, the address buffer sections ABS1 to ABSN produce first output signals A11 to AN1 at "0" level and second output signals A10 to AN0 at "1" level. As a result, the MOS transistors TR21, TR40 and TR42 to TR4N in the decoding circuit 50 shown in FIG. 5 are rendered conductive, while the MOS transistors TR22 to TR2N, TR31 to TR3N, and TR41 are rendered nonconductive.

When the chip select signal $\overline{CS}$ is at "1" level, the chip select circuit 90 shown in FIG. 7 produces a chip select signal CS at "0" level and chip select signals $\overline{CS1}$ and $\overline{CS2}$ at "1" level. Upon receipt of these chip select signals, the address buffer circuit shown in FIG. 6 is kept nonactive, so that the address buffer section ABS1 produces "0" output signals A11 and A10 and the address buffer sections ABS2 to ABSN produce "1" output signals A21 to AN1, and A20 to AN0. The MOS transistors TR21, TR31, TR40 and TR41 in the decoding circuit 50 shown in FIG. 5 are kept nonconductive while the MOS transistors TR22 to TR2N, TR32 to TR3N and TR42 to TR4N are kept conductive. Under this inactive state, the MOS transistors such as MOS transistors TR81, TR84, TR87, TR90 and TR93 coupled with the power source terminal VD in the address buffer circuit shown in FIG. 6 are nonconductive. Therefore, the power consumption is minimized. In the decoding circuit 50, the MOS transistors TR40 and TR41 are made nonconductive to prevent current from flowing from the power source terminal VD through the MOS transistors TR42 and TR4N. Further, the MOS transistors TR22 to TR2N and TR32 to TR3N are made conductive, so that the potentials at the nodes N1 and N2 are set at zero, so that the output signals from the buffer circuits 60 and 70 are set at "0" level.

Assume now that the chip select signal $\overline{CS}$ changes from "1" to "0" and the address buffer circuit 80 shown in FIG. 6 is changed over from the inactive state to the active state. In this case, the chip select signal CS goes to "1" and the chip select signal $\overline{CS1}$ goes to "0". Accordingly, when the address signal A1 is "0" in level, the MOS transistor TR92 is conductive while the MOS transistor TR95 is nonconductive. As a result, the address output signal A11 keeps "0" and the address output signal A10 goes to "1". A signal $\overline{CS2}$ is obtained by passing the signal CS through a Schmitt trigger type inverter circuit formed of the MOS transistors TR133 to TR136. More specifically, so long as the signal CS does not exceed a sum value of a potential determined by a mutual conductance ratio of the MOS transistors TR135 and TR136 and a threshold voltage of the MOS transistor TR134, the MOS transistor TR134 is not conductive and thus the signal $\overline{CS2}$ does not go to "0". Address output signals A21 to AN1 and A20 to AN0 from the address buffer sections ABS2 to ABSN in an inactive mode are set at VD level by the pull-up MOS transistors TR114 and TR115 and are kept at "1" level unless the signal $\overline{CS2}$ is "0", and therefore do not serve as effective address signals. Therefore, even if the address output signal A10 rises to a certain level, the potential at the node N2 is kept at "0" by the composite mutual conductance of the MOS transistors TR32 to TR3N and the composite mutual conductance of the MOS transistors TR40, and TR42 to TR4N. Then, when the signal CS exceeds a given level, the signal $\overline{CS2}$ becomes "0" in level. As a result, the MOS transistor TR111 and the corresponding transistors are made conductive and the address output signals A21 and AN1 are set at "0" and the MOS transistors TR2 to TR2N and TR32 to TR3N are all nonconductive. The result is that the MOS transistors TR31 to TR3N are nonconductive, the MOS transistors TR40, TR42 to TR4N are conductive and the potential at the node N2 is "1" level. Since the MOS transistor TR21 is conductive and the MOS transistor TR41 is nonconductive, the potential at the node N1 is kept at "0". In this case, the potential at the node N2 steeply rises from "0" to "1" irrespective of a rise time characteristic of the address output signal A10 as a drive signal of the MOS transistor TR40, so that a proper bootstrap operation is performed in the buffer circuit 70. For driving the buffer circuit 60, the address signal A1 is set at "1" level.

Figure 4:
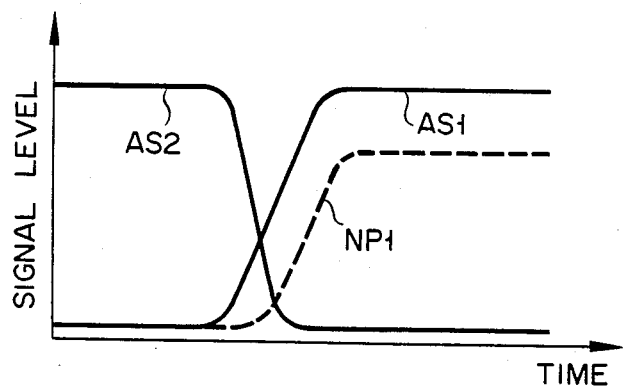
FIG. 4 is a graph showing changes of a drive voltage and an output voltage for illustrating the operation of the row decoder shown in FIG. 3.
Figure 8:
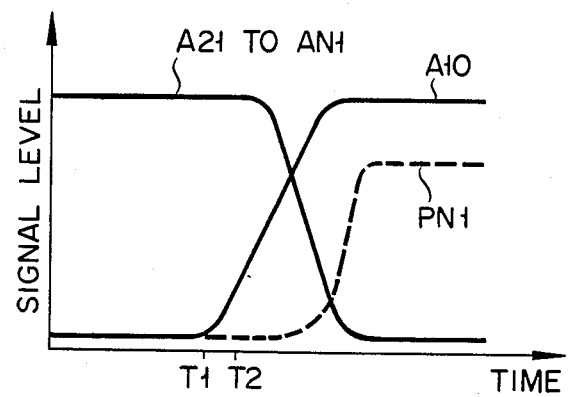
FIG. 8 shows a level change of a signal voltage for illustrating the operation of the drive circuit shown in FIGS. 5 to 7.

As described above, in the embodiment shown in FIGS. 5 to 7, in a condition that the address signals A1 to AN of "0" level is applied to the address buffer circuit, if the chip select signal $\overline{CS}$ is changed from "1" to "0" at the time T1 as shown in FIG. 8, the address output signal A10 in the address buffer section ABS1 gradually rises to "1" level. At time T2, when the chip select signal $\overline{CS2}$ from the chip select circuit becomes "0" level, the address output signals A21 to AN1 gradually falls toward "0" level. Then, the address output signals A21 to AN1 reach a value enough to render unconductive the MOS transistors TR22 to TR2N and TR32 to TR3N. Since, at this time, the ON-state resistances of the MOS transistors TR40 and TR42 to TR4N are sufficiently small, the potential PN1 at the node N2, as shown in FIG. 8, rises much more steeply than the prior case shown in FIG. 4.

Figure 1:
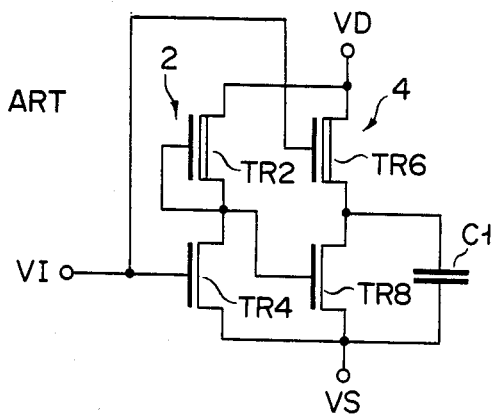
FIG. 1 is a circuit diagram of a conventional drive circuit for driving a node accompanied by a large stray capacitance.
Figure 2:
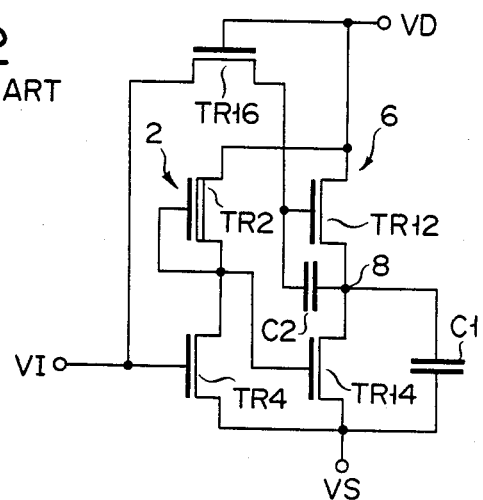
FIG. 2 is a circuit diagram of a conventional drive circuit with a bootstrap function.

While the present invention has been described by using a specific embodiment, the present invention may be modified or changed variously without departing from the technical scope of this invention. For example, the buffer circuits 60 and 70 may be replaced by a buffer circuit with a similar construction of the bootstrap buffer circuit shown in FIG. 2.

What we claim is:

1. A driver circuit comprising:
   a bootstrap buffer circuit of the static type;
   first drive means connected to drive said bootstrap buffer circuit and having a load circuit and a drive circuit coupled in series with said load circuit, and having means for generating an output signal at a junction between said load and drive circuits, said output signal being supplied to said bootstrap buffer circuit; and
   second drive means for applying to said first drive means a first drive signal for rendering said load circuit conductive and a second drive signal delayed with resepect to said first drive signal for rendering said drive circuit nonconductive after said load circuit is rendered conductive.

2. A driver circuit according to claim 1, wherein said second drive means includes a control circuit for generating first and second control signals at different timings, and a drive signal generating circuit for generating first and second drive signals in response to said first and second control signals from said control circuit.

3. A driver circuit according to claim 1 or 2, wherein said load MOS transistor circuit includes a plurality of MOS transistors whose current paths are connected in series, and said drive MOS transistor circuit includes a plurality of MOS transistors whose current paths are connected in parallel.

4. A driver circuit according to claim 3, wherein said load MOS transistor circuit has a larger resistance than that of said drive MOS transistor circuit when said load and drive MOS transistor circuits are conductive.

5. A driver circuit comprising:
   a bootstrap buffer circuit of the static type;
   first drive means connected to drive said bootstrap buffer ciruit and having a load circuit and a drive circuit coupled in series with said load circuit, and having means for generating an output signal at a junction between said load and drive circuits, said output signal being supplied to said bootstrap buffer circuit; and second drive means for supplying first and second drive signals, which are set at first and second levels, respectively, said first and second drive signals being supplied to said load and drive circuits, respectively, said second signal being changed to said second level to render said drive circuit nonconductive at a predetermined time after said first drive signal is changed to said first level to render said load circuit conductive and when said first drive signal is set substantially at said first level.

* * * * *